(12) United States Patent
Davids et al.

(10) Patent No.: US 9,391,225 B1
(45) Date of Patent: Jul. 12, 2016

(54) TWO-DIMENSIONAL APDS AND SPADS AND RELATED METHODS

(71) Applicant: Sandia Corporation, Albuquerque, NM (US)

(72) Inventors: Paul Davids, Albuquerque, NM (US); Douglas Chandler Trotter, Albuquerque, NM (US); Christopher DeRose, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 363 days.

(21) Appl. No.: 13/915,369

(22) Filed: Jun. 11, 2013

(51) Int. Cl.
*G01J 1/42* (2006.01)
*H01L 31/107* (2006.01)
*G02B 6/10* (2006.01)
*G02B 6/24* (2006.01)
*H01L 31/02* (2006.01)
*G02B 6/02* (2006.01)

(52) U.S. Cl.
CPC .............. *H01L 31/1075* (2013.01); *G02B 6/02* (2013.01); *G02B 6/10* (2013.01); *G02B 6/24* (2013.01); *H01L 31/02027* (2013.01); *H01L 31/107* (2013.01)

(58) Field of Classification Search
CPC .............. G02B 6/02; G02B 6/10; G02B 6/24; H01L 31/02027
USPC ......... 250/227.11, 227.14, 21, 184, 186, 263; 257/21, 184, 186, 263
See application file for complete search history.

(56) References Cited

U.S. PATENT DOCUMENTS

| | | | | |
|---|---|---|---|---|
| 7,741,657 B2 * | 6/2010 | Pauchard | ........ | H01L 31/035281 257/185 |
| 2004/0251483 A1 * | 12/2004 | Ko et al. | ........................ | 257/292 |
| 2007/0104441 A1 * | 5/2007 | Ahn et al. | ........................ | 385/129 |
| 2008/0231339 A1 * | 9/2008 | Deschamps | ........................ | 327/326 |
| 2012/0126286 A1 * | 5/2012 | Na et al. | ........................ | 257/186 |
| 2015/0097256 A1 * | 4/2015 | Ang | .................... | H01L 31/1075 257/432 |

* cited by examiner

*Primary Examiner* — Georgia Y Epps
*Assistant Examiner* — Kevin Wyatt
(74) *Attorney, Agent, or Firm* — Capitol Patent & Trademark Law Firm PLLC; Aman Talwar

(57) ABSTRACT

Avalanche photodiodes (APDs) and single photon avalanche detectors (SPADs) are provided with a lateral multiplication region that provides improved amplification through increased impact ionization.

36 Claims, 6 Drawing Sheets

TWO-DIMENSIONAL APDS AND SPADS AND RELATED METHODS

GOVERNMENT LICENSE RIGHTS

This invention was developed under Contract DE-AC04-94AL85000 between Sandia Corporation and the U.S. Department of Energy. The U.S. Government has certain rights in this invention.

INTRODUCTION

Avalanche photodiodes (APDs) may be used to convert optical signals into amplified, electrical signals. Due to their ability to greatly amplify a received signal, APDs may be used as very sensitive detectors that permit optical signals of extremely low power to be received, and then converted into amplified (higher power) electrical signals that are more easily measured.

When operated in a so-called "Geiger mode", APDs may be used to receive and measure a single photon. These devices may also be referred to as "single photon avalanche detectors" (SPADs).

Typically, APDs as well as SPADs may be formed as a layered "stack" of various semiconductor materials. APDs and SPADS that use this stacked configuration may be referred to as "one dimensional" APDs or SPADs). However, the use of a stack of layers places limitations on the design of an APD or SPAD. For example, certain design modifications that may improve the operation of one layer may degrade the performance of the remaining layers.

Accordingly, it is desirable to provide improved APDs and SPADs that avoid the degrading effects of existing APDs and SPADs.

SUMMARY

The present invention provides devices and related methods that overcome problems related to existing APDs and SPADs. For example, in one embodiment an inventive device (e.g., APD or SPAD) may comprise: an optical waveguide configured to transport an optical signal; a germanium absorption layer, disposed over a charge region of a silicon surface layer, to receive and absorb photons from the optical signal, and to generate one or more mobile carriers from the absorbed photons; and a silicon surface layer, where the layer may comprise a charge region of a first conductivity type, and a multiplication region, laterally adjacent to the charge region, to receive the one or more mobile carriers and generate an amplified photocurrent. The multiplication region may further be separate and spaced-apart from the germanium absorption layer. Thus, rather than use a traditional configuration, this embodiment, and others, provide for configurations that may position a multiplication region adjacent, separate and apart from an absorption layer.

In the inventive device, the silicon surface region may further comprise an integrated quenching region adjacent to the multiplication region to control the generated photocurrent. This quenching region may alternatively comprise a passive or active quenching region. When configured as a passive quenching region the region may comprise a resistive region.

In more detail, in embodiments of the invention the charge region may comprise a p-type, conductivity doped silicon region, the multiplication region may comprise an intrinsic silicon region, and the optical waveguide may comprise an integrated, silicon-based waveguide, such as a single mode waveguide (for example).

Inventive devices may comprise two or three electrical contact regions. When configured with three electrical contact regions one of the three regions comprises a charge region, and two of the three electrical contact regions may be operable to receive electrical inputs to create a bias voltage to accelerate a flow of one or more mobile carriers into the multiplication region.

In an additional embodiment of the invention a device may comprise an optical waveguide that is positioned with respect to a germanium absorption layer so as to couple an optical signal transported by the waveguide to the germanium absorption layer. In more detail, the optical waveguide may be positioned with respect to the germanium absorption layer so as to evanescently couple the optical signal to the germanium absorption layer. In one alternative embodiment the optical waveguide may be positioned on a top surface of the germanium absorption layer; in another, the optical waveguide may be positioned on a side surface of the germanium absorption layer.

In yet another embodiment a device may comprise an optical waveguide that comprises a silicon-based material, such as silicon-nitride for example, which generates a strain at an interface with a germanium absorption layer.

In addition to the inventive devices described above, the present invention also provides for related methods. For example, one exemplary method may comprise: transporting an optical signal in an optical waveguide connected to a germanium absorption layer; receiving and absorbing photons from the optical signal, and generating one or more mobile carriers from the absorbed photons at the germanium absorption layer disposed over a charge region of a first conductivity type of a silicon surface layer; and receiving the one or more mobile carriers and generating an amplified photocurrent at a multiplication region, laterally adjacent to the charge region, of the silicon surface layer. As mentioned before, rather than use the traditional configuration the multiplication region may be laterally positioned from the absorption layer and may be separate and spaced-apart from the absorption layer.

The method may additionally comprise controlling the generated photocurrent using an integrated quenching region adjacent to the multiplication region of the silicon surface layer. Similar to the above description, the quenching may be passive or active. When passive, the quenching region may comprise a resistive region.

The inventive method may involve the use of a p-type, conductivity doped silicon charge region, an intrinsic silicon multiplication region and an integrated, silicon based optical waveguide, for example, where the integrated, silicon-based waveguide may further comprise a single mode waveguide.

An additional inventive method may include a device that uses two or three electrical contact regions. For example, in a exemplary method two out of the three contact regions may be used to create a bias voltage to accelerate a flow of one or more mobile carriers into a multiplication region.

In still another inventive method, an optical signal may be coupled to a germanium absorption layer by positioning an optical waveguide with respect to the germanium absorption layer. In particular, the optical signal may be evanescently coupled to the germanium absorption layer by positioning the optical waveguide on a top or side surface of the germanium absorption layer.

A further inventive method may comprise generating a strain at an interface of an optical waveguide and a germanium absorption layer using a silicon-based material, such as silicon nitride for example, in the optical waveguide.

Other and further embodiments and aspects of the present invention will become apparent during the course of the following discussion and by reference to the accompanying drawings.

DETAILED DESCRIPTION, WITH EXAMPLES

Figure 1:
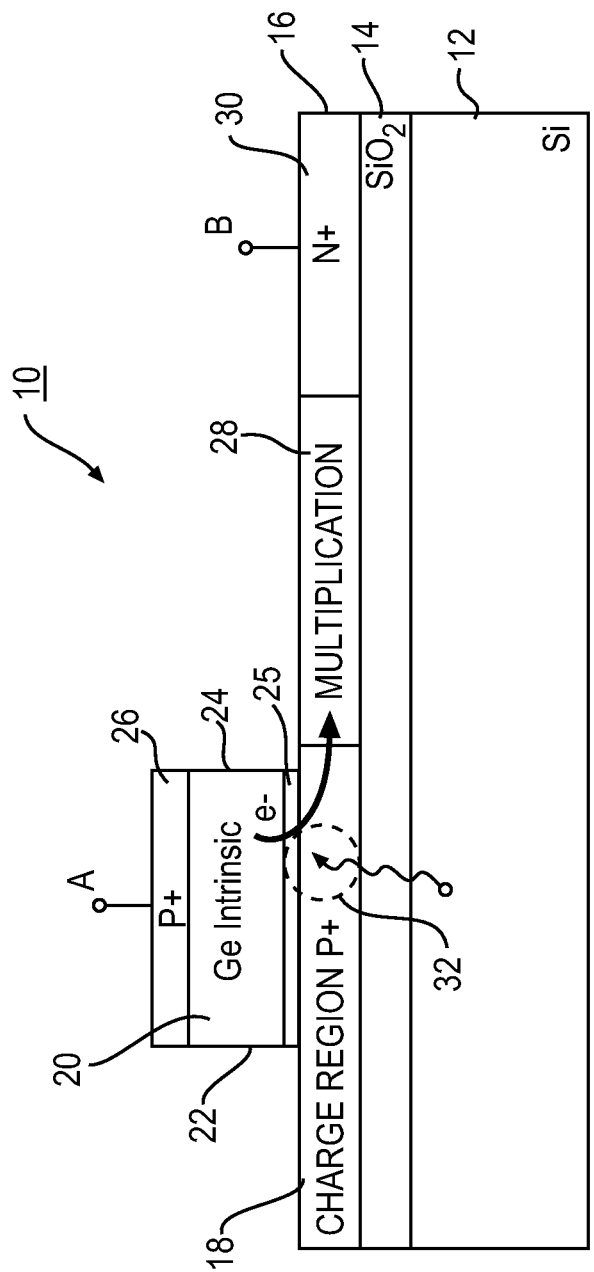
FIG. 1 is a side view of an exemplary device in accordance with an embodiment of the present invention.

Exemplary embodiments of two-dimensional optical devices, such as APDs and SPADs, and related methods are described herein in detail and shown by way of example in the drawings. Throughout the following description and drawings, like reference numbers/characters refer to like elements. It should be understood that, although specific exemplary embodiments are discussed herein there is no intent to limit the scope of present invention to such embodiments. To the contrary, it should be understood that the exemplary embodiments discussed herein are for illustrative purposes, and that modified and alternative embodiments may be implemented without departing from the scope of the present invention.

It should be further noted that some exemplary embodiments may be described and claimed as a process or method (hereafter "method"). Though a method may be described and claimed as set of sequential steps, it should be understood that the steps may be performed in parallel, concurrently or simultaneously. In addition, the order of each step within a method may be re-arranged. A method may be terminated when completed, and may also include additional steps not necessarily described herein. A method may correspond to functions or processes completed by a physical component.

It should be understood that, although the terms first, second, etc., may be used herein to describe various elements of a device, such as an APD or SPAD, such elements should not be limited by these terms. Instead, these terms are used to merely distinguish one component from another. For example, a first contact area could be termed a second contact area, or vice-versa, without departing from the scope of the disclosed embodiments. As used herein, the term "and/or" includes any and all combinations of one or more of the associated listed items. It should be understood that if an element is referred to, or depicted, as being positioned "over", or "adjacent" another element, or connected to another element, it may be directly over, adjacent, or connected to, the other element or intervening elements may be present, unless otherwise specified. As used herein, the singular forms "a," "an" and "the" are not intended to include the plural form unless the context clearly indicates otherwise.

Unless specifically stated otherwise, or as is apparent from the discussion, the phrase "operable to" means at least having the capability of operating to complete, and/or is operating to complete, specified features, functions, process steps, or having the capability to meet desired characteristics, or meeting desired characteristics.

As used herein, the term "embodiment" refers to an example of the present invention.

FIG. 1 depicts a side view of a device 10, such as an APD, according to one embodiment of the present invention. The device 10 may comprise a silicon substrate 12, an insulating layer 14 and a relatively thin (e.g., less than one micron) silicon surface layer 16. The insulating layer 14 may be made from silicon dioxide ($SiO_2$) for example. Together, the substrate 12, and layers 14,16 may be referred to as a silicon-on-insulator or SOI structure or "platform".

In more detail, the silicon surface layer 16 may comprise a region 18 formed within a predetermined area of the layer 16. In the example shown in FIG. 1, region 18 may comprise a p-type, conductivity doped silicon region (Si) or "charge" region for short. It should be understood that the device 10 includes a complementary doping configuration where for the sake of illustration, a "first" dopant type may be p-type silicon, and a "second" dopant type may be n-type silicon. Thus, the region 18 may be referred to as a charge region of a first conductivity type within layer 16.

Continuing, the device 10 may further comprise a germanium (Ge), photon absorption layer 20 which may be positioned over region 18. In the embodiment depicted in FIG. 1 the layer 20 may be positioned such that region 18 may extend laterally in either direction beyond sidewalls 22 and 24 of the layer 20, it being understood that a portion of region 18 extends beyond (i.e., region 18 is wider than layer 20 at their interface) the right-hand side wall 24 of layer 20 in order to insure that an electric field is created within the multiplication region 28. In one exemplary embodiment, the layer 20 may comprise an epitaxial layer of germanium that is not originally a part of the layer 16, but which may be grown on the silicon surface layer 16 using a selective epitaxial growth process known in the art, for example. A p-type silicon contact area or first electrical contact region 26 may be formed over the germanium layer 20. The contact region may function as a first electrical terminal "A" used to establish a reverse bias current in the APD 10 along with a second electrical contact region, or terminal "B" discussed below.

The layer 16 may further comprise a multiplication region 28. In the embodiment depicted in FIG. 1 the region 28 may be positioned laterally adjacent to region 18. Region 28 may comprise an intrinsic, non-doped (non-conductive) silicon region. It should be noted that the device 10 differs from existing one-dimensional devices (e.g., APDs) because existing devices stack a multiplication region over a germanium layer. In contrast, the device 10 includes a multiplication region 28 that is laterally adjacent to the germanium layer. Accordingly, the inventive device 10 depicted in FIG. 1 may be referred to as a two-dimensional device. Yet further, region 28 may be positioned to be separate and spaced-apart from the germanium absorption layer 20. This spatial separation between the multiplication region 28 and the germanium (photon) absorption region 20 may permit the absorption of photons within region 20 to be optimized independently of the amplification (i.e., impact ionization rate) within the multiplication region 28.

The layer 16 may still further comprise a second, or n-type silicon contact region 30 that may function as the second electrical terminal "B".

The p-type, charge region 18 may be operable to generate an electric field that transportably guides carriers that may be generated in the germanium absorption layer 24 into the multiplication region 28, as explained below.

In an embodiment of the invention, the device 10 may operate as follows. An incoming optical signal "O" may be coupled into an area 32 of the p-type charge region 18 that may be directly underneath the germanium layer 24 via an optical waveguide (not shown in FIG. 1; but see FIG. 4, element 40), for example. The optical signal O may comprise wavelengths above 1100 nanometers (nm), for example 1300 and 1550 nm.

In the presence of a strong reverse bias voltage ($V_{BV}$) applied between terminals A and B (e.g., tens of volts or higher), the germanium layer 24 may be operable to receive and absorb photons forming optical signal O and to generate and output one or more mobile carriers from the absorbed photons. In more detail, the layer 24 may be operable to create one or more electron-hole pairs that flow into multiplication region 28. In turn, multiplication region 28 may be operable to receive the one or more electron-hole pairs (mobile carriers) and generate an amplified electrical photocurrent. The amplified photocurrent may also be referred to as an "avalanche" photocurrent or a photocurrent generated by an avalanche effect; thus the name avalanche photodiode. The multiplication region 28 may be operable to generate the amplified photocurrent via an impact ionization process which is known by those in the art.

Figure 2:
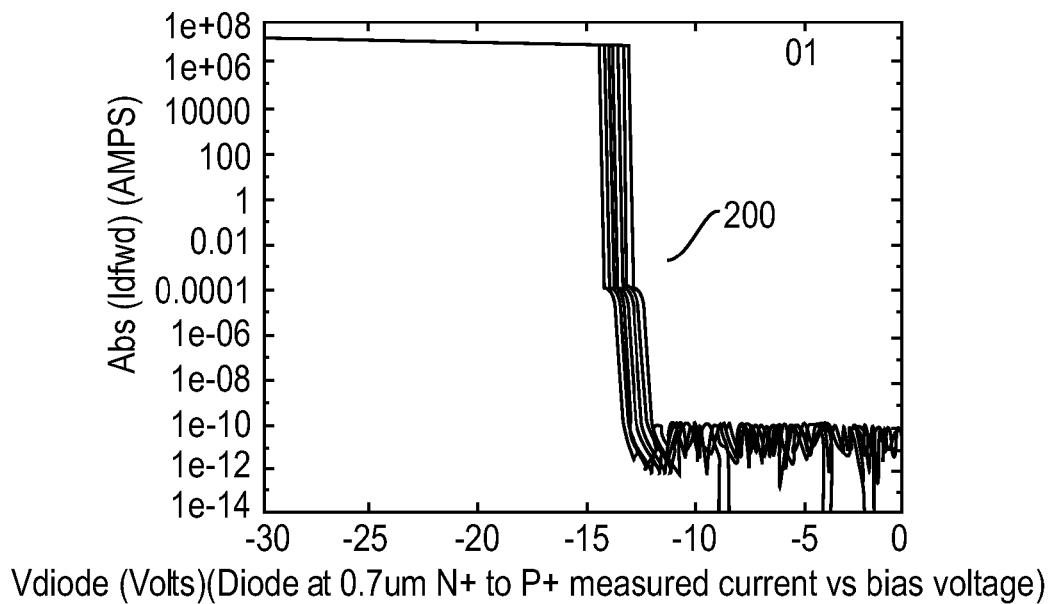
FIG. 2 depicts an exemplary graph of a generated photo-current versus reverse bias voltage for an exemplary device according to an embodiment of the present invention.

FIG. 2 depicts an exemplary graph 200 of a generated photocurrent versus (i.e., as a function of) reverse bias voltage $V_{BV}$ for an inventive APD, such as device 10 in FIG. 1. In the exemplary graph 200 the avalanche effect (i.e., initiation of a measurable photocurrent) was triggered at a reverse bias voltage of 13V, with charge region 18 of device 10 comprising a doping level on the order of $10^{18}$, for example.

Figure 3:
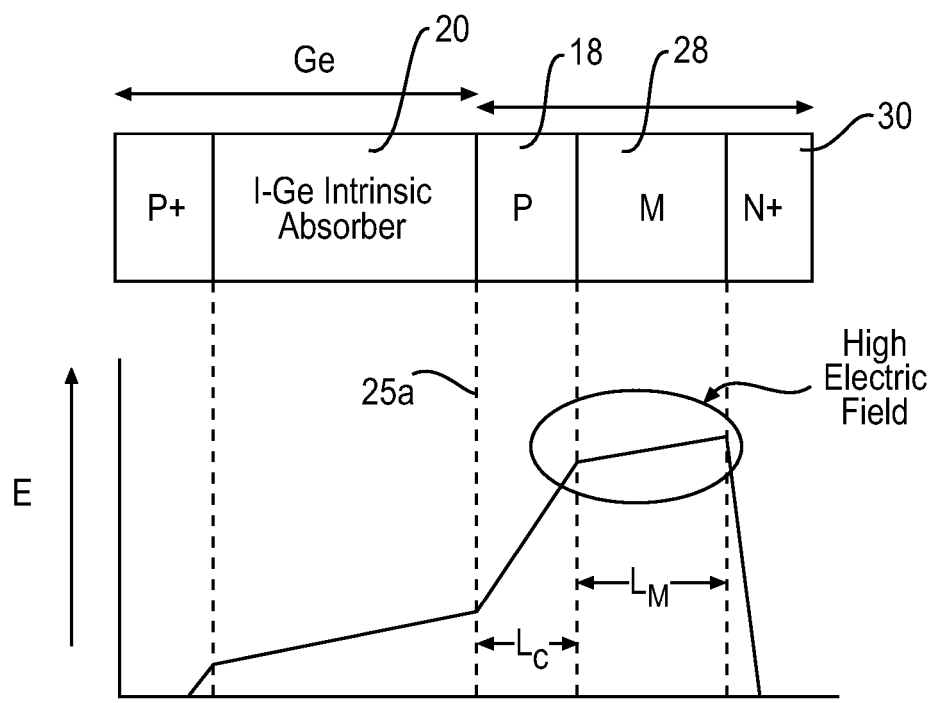
FIG. 3 depicts a graph of electric fields generated within various regions of an exemplary device according to an embodiment of the present invention.

FIG. 3 depicts a graph of a generated electric field versus depth within an APD, such as device 10 in FIG. 1. As seen in FIG. 1, a heterojunction layer 25 may be positioned between the germanium absorption layer 20 and a charge region 18. In an embodiment of the invention layer 25 may be advantageously placed at a position where the increase with depth of the field generated by the change region 18 begins to steepen (a vertical line 25a has been added to FIG. 3 to indicate the position of layer 25). The length "$L_C$" of the charge region 18 may be selected in association with a specific breakdown voltage of the APD 10, as well as the level of dark current that can be tolerated. Dark current is associated with the generation of an electrical photocurrent that may be output even in the absence of an input optical signal, and represents the thermal noise inherently present in the device 10.

As shown in FIG. 3, the electric field generated by the region 18 may be strongest (highest) within multiplication region 28, but does not increase as rapidly as compared to the electric field within charge region 18. Indeed, the electric field within multiplication region 28 may remain essentially constant, which may be desirable for some applications. The length "$L_M$" of multiplication region 28 may dictate the amount of gain (amplification) that may be produced, and may be generally on the order of a few microns.

In accordance with an embodiment of the invention, the second electrical contact region 30 may be operable to substantially suppress or extinguish the multiplication or amplification effect (hereafter collectively referred to as "amplification" effect) by reducing the electric field to a small value, or even to zero. Alternatively, as will be discussed below, an inventive device may include a "quenching" region that may be operable to substantially suppress or extinguish the amplification effect.

In accordance with embodiments of the invention, the device 10 may be formed using CMOS processing techniques in order to control the size, shape and doping of each individual region and layer. Inventive devices provided by the present invention may be compact in form, and may be doped in a manner that make them attractive as low photon-count responsive devices, with potentially high bandwidth-power product, as will be described in more detail herein.

Figure 4:
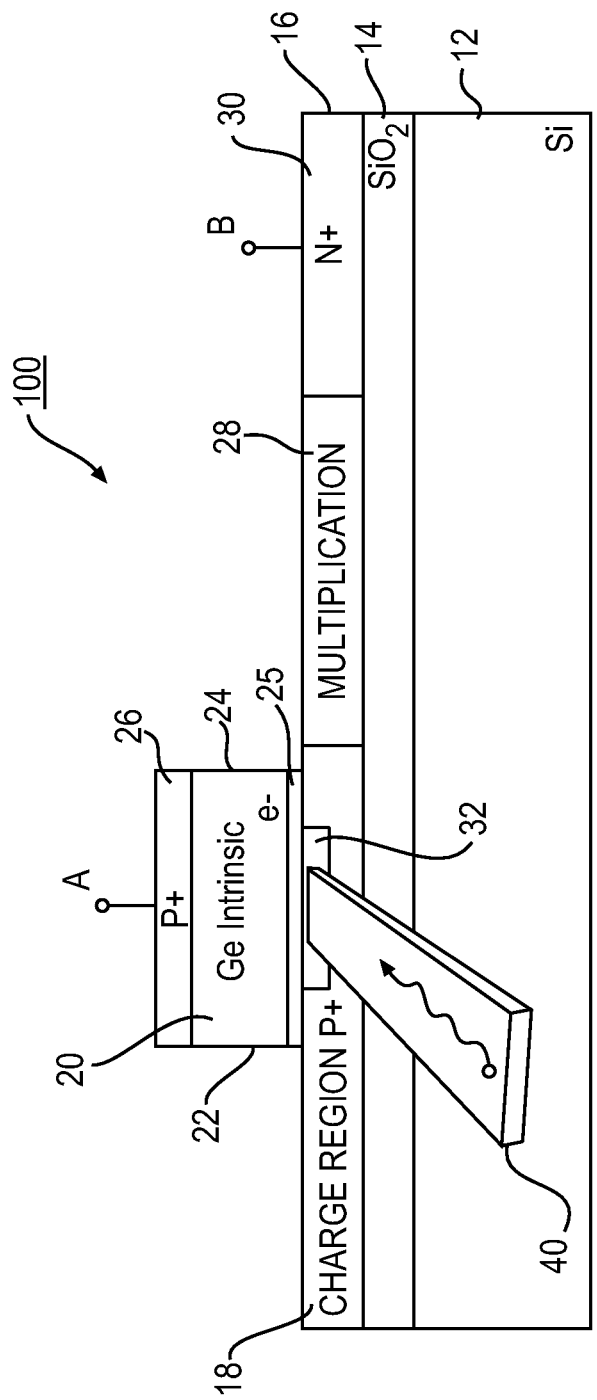
FIG. 4 depicts a view of an alternative device in accordance with another embodiment of the invention.

Referring now to FIG. 4 there is depicted an alternative two-dimensional device 100, such as an APD, in accordance with another embodiment of the invention. In accordance with embodiments of the present invention, various methods of coupling an optical signal may be used. For example, the device 100 may include an end-fire coupling into area 32 of region 16 using a waveguide, optical fiber or free-space signal. Alternatively, the present inventors discovered that a waveguide may also be integrated into the same silicon platform within the device 100. FIG. 4 depicts a view of the device 100 that comprises such an integrated silicon-based waveguide. As shown, the silicon surface layer 16 may comprise an integrated waveguide 40 (shown extended from area 32). This integrated, monolithic configuration may be preferred in applications where a more compact device may be required. Additionally, the use of standard CMOS processing techniques allows the silicon waveguide 40 to be positioned or otherwise formed in optical alignment with the germanium absorption layer 20, thus reducing optical coupling losses. Yet further, the integrated waveguide 40 may comprise a single mode waveguide. Heretofore, such a waveguide is difficult to create and maintain if it were not integrated into a device (e.g., an APD).

Figure 5:
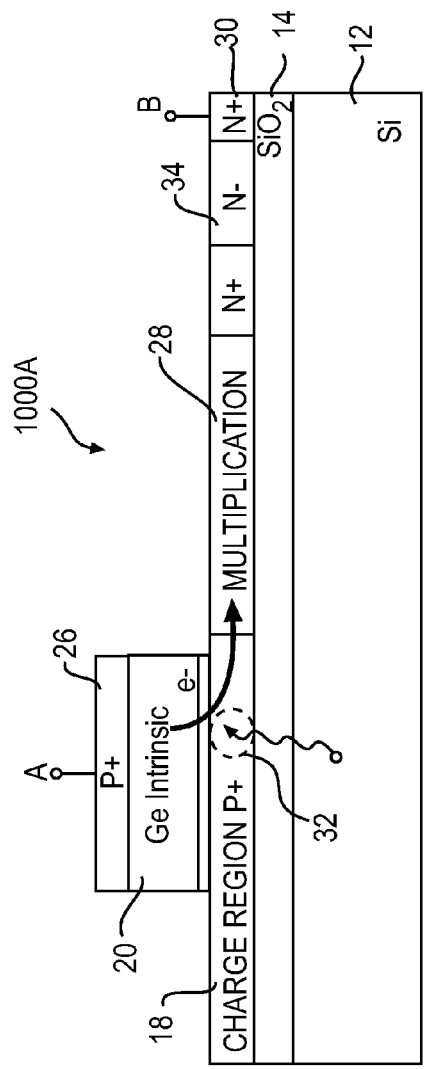
FIG. 5 depicts a side view of a device that comprises a quenching region according to an embodiment of the invention.

Referring now to FIG. 5 there is depicted a side view of a two-dimensional device 1000a that comprises a quenching region 34 according to an embodiment of the invention. A quenching region may be used to reduce the breakdown voltage for a period of time in order to sufficiently suppress or extinguish the amplification process within a multiplication region. Said another way, a quenching region may be viewed as controlling the amplified photocurrent of the multiplication region. For example the quenching region 34 may control the switching speed of an APD by turning the amplification process "off", thereby allowing the APD to be "ready" to receive a next optical signal that may turn the APD "on". As will be discussed below, a quenching region (or "quenching") is used in SPADs or "Geiger mode" APDs. Continuing, in one embodiment the quenching region 34 may comprise a resistor (e.g., a quench resistor) or resistive region. Still further, the quenching region 34 may be created by modifying the concentration of the dopant within the second contact region 30, for example. For example, if the concentration is reduced the quenching region 34 may comprise a lightly-doped area, shown as N− in FIG. 5. A device (e.g., APD) that uses the type of quenching region depicted in FIG. 5 may be referred to as using "passive" quenching because the resistance of the region is the only parameter that is modified to control the amplification process.

Figure 6:
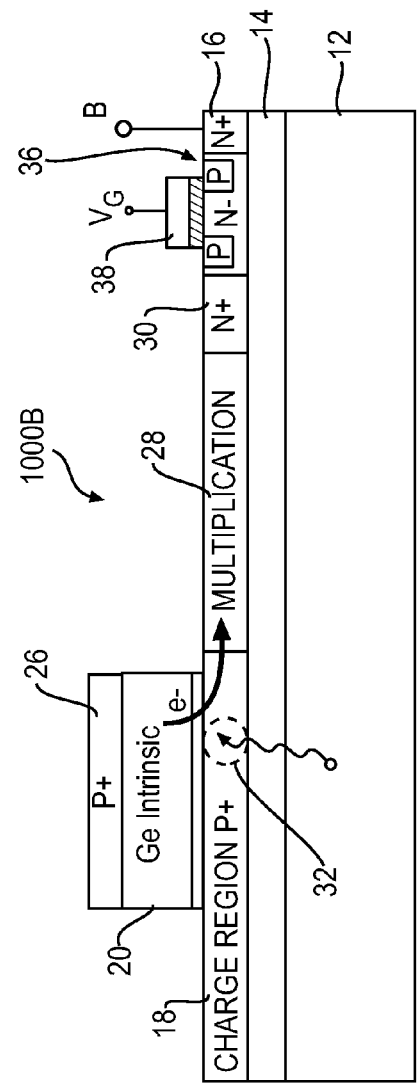
FIG. 6 depicts a device that comprises an alternative quenching region according to an embodiment of the invention.

Alternatively, rather than use passive quenching an inventive device may use active quenching. FIG. 6 depicts an exemplary two-dimensional device 1000b (e.g., APD) that comprises an integrated, active quenching region 36 according to an embodiment of the invention. In the embodiment depicted in FIG. 6 the active quenching region 36 may comprise an MOS transistor structure 36 positioned adjacent to the multiplication region 28. In an exemplary operation of the region 36 a gate voltage ($V_G$) may be applied to a gate 38 of structure 36 in order to control or adjust (collectively "control") the speed at which the amplification process is suppressed or extinguished. The structure depicted in FIG. 6 is just one of many structures that may be implemented to control the amplification process in accordance with the present invention.

Figure 7:
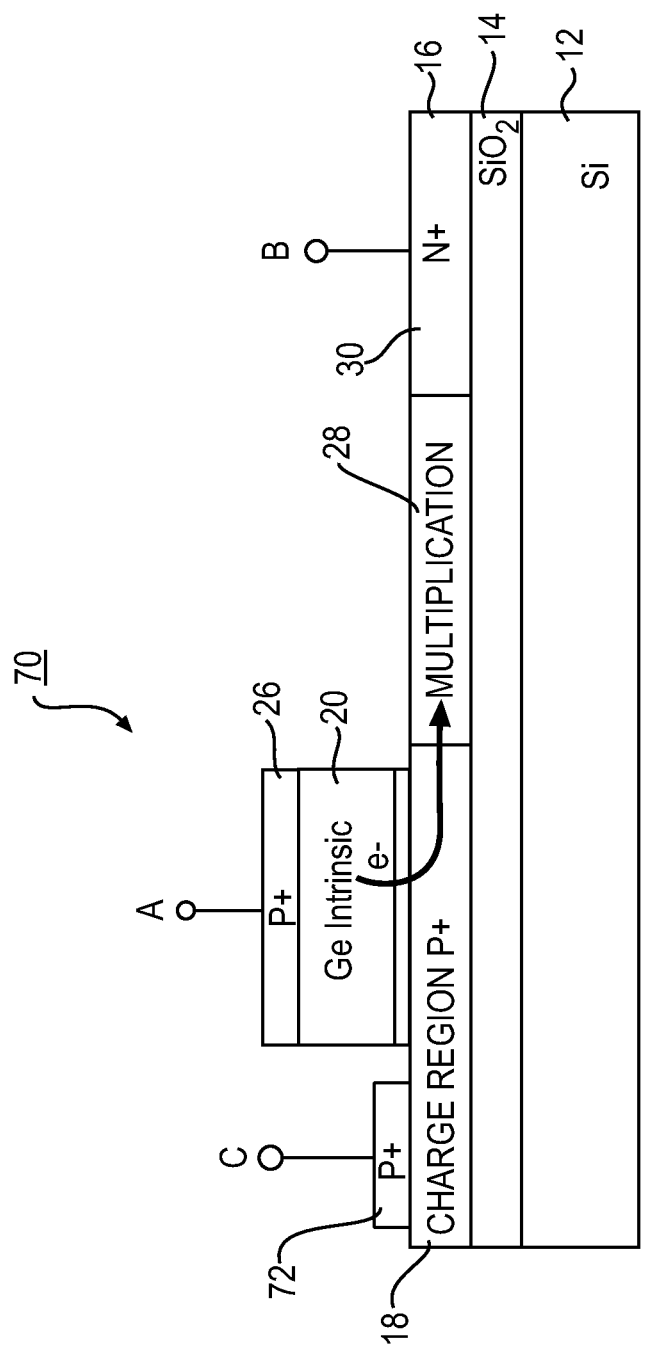
FIG. 7 is a side view of a three terminal device according to an embodiment of the present invention.

In order for a device, such as an APD, to operate at its highest level of efficiency the strength of the electric field within a multiplication region should be stronger (higher) than the strength of the electric field within a germanium absorption layer (see FIG. 3, for example). The difference in electric fields between the two portions of an APD results in the flow of mobile carriers (electron-holes) into the multiplication region. In an embodiment of the invention a highly efficient device, such as an APD, may be configured to include three-terminals. FIG. 7 depicts a side view of a three terminal, two-dimensional device 70 in accordance with an embodiment of the present invention.

As shown in FIG. 7, device 70 includes elements similar to those of the device 1 in FIG. 1, and additionally includes a third electrical contact region 72. Region 72 may be configured, for example, as a p-type conductivity charge region. Region 72 may also comprise, and be referred to as, terminal "C". As depicted, device 70 comprises three electrical contact regions. In an embodiment of the invention the charge region 18 may be configured to include one of the three electrical contact regions, in this case region 72 (terminal C). It should be noted that the region 18 extends beyond the perimeter of the germanium absorption layer 20 so as to accommodate the formation of a third electrical contact region 72.

In an embodiment of the invention, when a voltage is applied between terminals C and A, an electric field may be created within germanium absorption layer 20, allowing for mobile carriers formed by the absorption of photons to be quickly swept out of layer 20 and accelerated into multiplication region 28. A large reverse bias may be applied between terminals A and B to support the amplification process (i.e., impact ionization process and avalanche reactions within multiplication region 28). The inventors discovered that the application of a bias voltage between terminals C and A may improve the quantum efficiency (QE) of the device 70 (e.g., APD). Accordingly, in an embodiment of the invention two of three electrical contacts (e.g., the terminals A and C) may be operable to receive electrical inputs to create such a bias voltage. The voltage created between the terminals A and C may be controlled with respect to a high voltage applied to terminal B such that breakdown occurs in multiplication region 28, and not within the germanium absorption layer 20. Said another way, the electric field produced in the germanium absorption region 20 is less than the electrical field produced in the multiplication region 28, forcing breakdown to occur only in multiplication region 28. This has the effect of increasing or accelerating the flow of one or more mobile carriers into the multiplication region 28 by increasing the percentage of incoming photons that yield charge carriers. This flow increases the gain (amplification) created by the multiplication region 28.

As mentioned above, an SPAD, also known as a Geiger-mode APD, is a device in which a single carrier can trigger an amplification effect in a multiplication region. As a result, an SPAD may be able to detect extremely low intensity input optical signals (i.e., down to a single photon) and "announce" the arrival times of these single photons with a jitter of only a few tens of picoseconds. One difference between an SPAD and the APDs described herein is that an SPAD is designed to operate with a reverse bias voltage well above its associated breakdown voltage. The effect is that the generated electric field is so high that a single charge carrier injected into a multiplication region can trigger a self-sustaining amplification effect.

As a result of this self-sustaining effect, a SPAD must include some means for turning "off" the generated electrical photocurrent so that the next incoming photon can be properly detected. As described in early embodiments herein, a quenching region may be used. Quenching the photocurrent of the amplification effect and resetting an SPAD typically involves a two-step process. In the first step a bias voltage is reduced below the breakdown voltage, thereby quenching a photocurrent as quickly as possible. In a second step, the bias voltage is then raised to a voltage above the breakdown voltage, as discussed previously, so that the next low intensity input optical signal (e.g., photon) may be detected.

Figure 8:
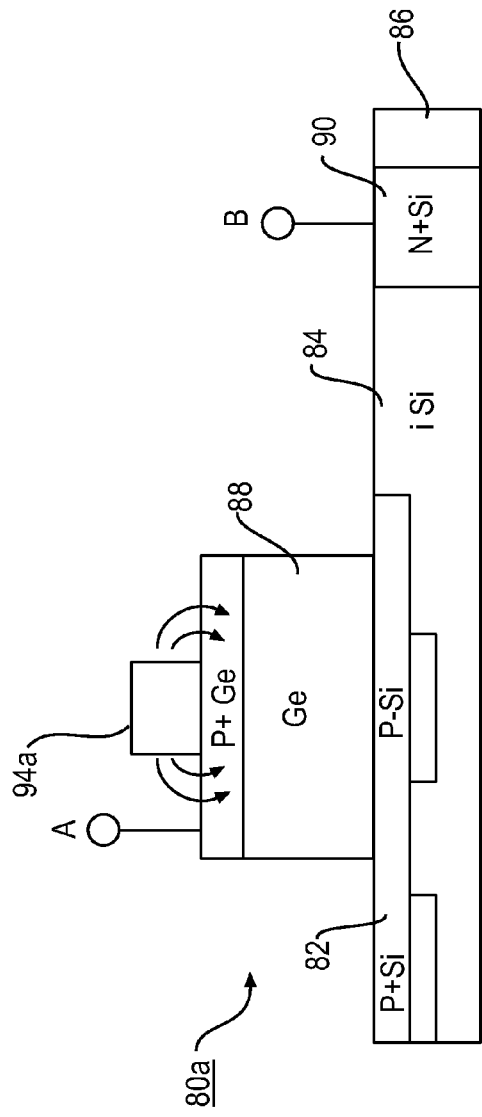
FIG. 8 is a side view of an SPAD in accordance with an embodiment of the present invention.

FIG. 8 illustrates an exemplary two-dimensional device 80a, such as an SPAD, in accordance with an embodiment of the present invention. Similar to the embodiments described before, device 80a may include a silicon platform comprising a silicon surface layer 86 of an SOI structure that comprises a p-type conductivity charge region 82 and an (intrinsic) multiplication region 84. Further, the device 80a may comprise a germanium absorption layer 88 positioned over region 82, and an n-type conductivity contact region 90. To insure that the device 80a is responsive (i.e., turns on and off quickly) a quenching region may be included (not shown in FIG. 8). In order to function as an SPAD, the voltage applied between terminals A and B needs to be above the breakdown voltage of the device. Accordingly, the device 80a may include first and second contact regions A, B that are operable to receive signals to create a voltage greater than a predetermined breakdown.

In contrast to the embodiments described in earlier figures, the device 80a may utilize evanescent coupling to introduce an optical input signal into a germanium absorption layer 88. Evanescent coupling may occur even though elements are not in direct physical contact with one another, provided, however, such elements are in close proximity to each other to allow their respective mode fields to overlap. For example, in one embodiment of the invention an optical waveguide or waveguiding layer 94a ("waveguide" for short) may be positioned with respect to the germanium absorption layer 88, for example, to couple the optical signal to the germanium absorption layer 88. More particularly, the optical waveguide 94a may be positioned on a predetermined extent of a top surface of the germanium absorption layer 88 to couple the optical signal to the germanium absorption layer 88, for example.

In the embodiment depicted in FIG. 8 the waveguide 94a may comprise a silicon nitride waveguide positioned with respect to the germanium absorption layer 88 to allow the optical signal propagating along the longitudinal extent of the waveguide 94a to evanescently couple into germanium layer 88 (as shown by the arrows in FIG. 8). The use of a silicon nitride material as layer 94a allows for the use of multiple wavelengths through the visible and near-IR part of the spectrum (e.g., wavelengths above 1100 nm, such as 1300 and 1550 nm) because the presence of silicon nitride generates a mechanical-type strain at an interface with the germanium absorption layer 88 that shifts the bandwidth of the layer 88 to longer wavelength values. It should be understood, however, that various other silicon-based materials may be used as layer 94*a* in accordance with the present invention.

The use of evanescent coupling (as opposed to, e.g., direct end-face coupling) may significantly reduce optical reflections at the interface between the waveguide 94*a* and layer 88, for example, thus improving the quantum efficiency of the device 80*a*, an important parameter for SPAD devices due to the need to operate with greater sensitivities as compared to conventional APDs.

Figure 9:
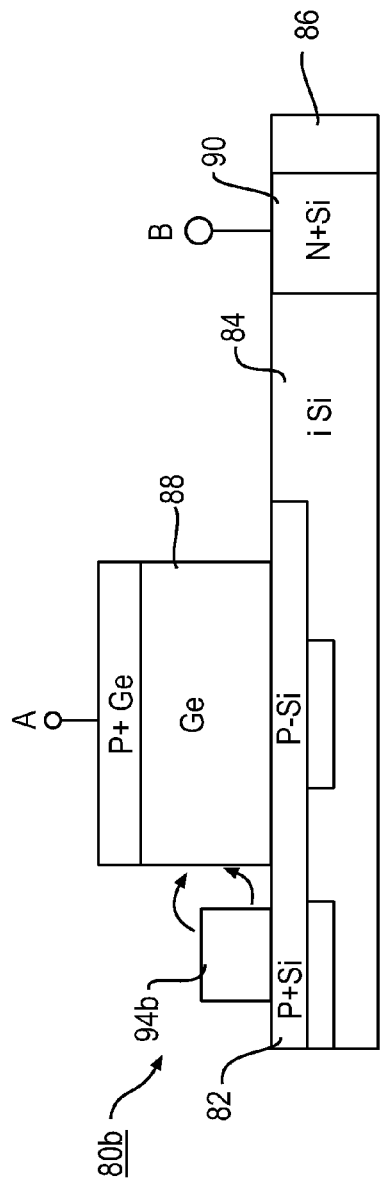
FIG. 9 is a side view of an alternative SPAD in accordance with an embodiment of the present invention.

FIG. 9 depicts an alternative embodiment of the invention. In FIG. 9 a device 80*b*, such as a SPAD, may comprise a waveguide 94*b* positioned to a second position to couple the optical signal to the germanium absorption layer 88. In the example shown in FIG. 9 the waveguide 94*b* may be positioned on a predetermined extent of a side surface of the germanium absorption layer 88 to couple the optical signal to the germanium absorption layer 88.

Although the invention has been described in detail with particular reference to the embodiments described herein, other embodiments may be created that also utilize the inventive structures integrated within a silicon substrate as well as methods. Variations and modifications of the present invention will be apparent to those skilled in the art and such variations and modification, as well as their equivalents, are intended to covered by the claims that follow.

What is claimed is:

1. A device comprising:
    an optical waveguide configured to transport an optical signal;
    a germanium absorption layer, disposed over a charge region of a silicon surface layer, to receive and absorb photons from the optical signal, and to generate one or more mobile carriers from the absorbed photons;
    a silicon surface layer comprising,
        a charge region of a first conductivity type, wherein the charge region underlies an entirety of the germanium absorption layer, and
        a multiplication region, laterally adjacent to the charge region, to receive the one or more mobile carriers and generate an amplified photocurrent; and
    a heterojunction layer between the germanium absorption layer and the silicon surface layer, wherein the multiplication region is disjointed from the heterojunction layer.

2. The device as in claim 1 wherein the multiplication region is separate and spaced-apart from the germanium absorption layer.

3. The device as in claim 1 wherein the silicon surface region further comprises an integrated quenching region adjacent to the multiplication region to control the generated photocurrent.

4. The device as in claim 3 wherein the quenching region comprises a passive quenching region.

5. The device as in claim 4 wherein the passive quenching region comprises a resistive region.

6. The device as in claim 3 wherein the quenching region comprises an active quenching region.

7. The device as in claim 1 wherein the charge region comprises a p-type, conductivity doped silicon region, and the multiplication region comprises an intrinsic silicon region.

8. The device as in claim 1 wherein the optical waveguide comprises an integrated, silicon-based waveguide.

9. The device as in claim 8 wherein the integrated, silicon-based waveguide comprises a single mode waveguide.

10. The device as in claim 1 further comprising three electrical contact regions, wherein the charge region comprises one of the three electrical contact regions.

11. The device as in claim 10 wherein two of the three electrical contact regions receive electrical inputs to create a bias voltage to accelerate a flow of the one or more mobile carriers into the multiplication region.

12. The device as in claim 1 wherein the optical waveguide is positioned with respect to the germanium absorption layer so as to couple the optical signal to the germanium absorption layer.

13. The device as in claim 12 wherein the optical waveguide is positioned with respect to the germanium absorption layer so as to evanescently couple the optical signal to the germanium absorption layer.

14. The device as in claim 12 wherein the optical waveguide is positioned on a top surface of the germanium absorption layer.

15. The device as in claim 12 wherein the optical waveguide is positioned on a side surface of the germanium absorption layer.

16. The device as in claim 12 wherein the optical waveguide comprises a silicon-based material to generate a strain at an interface with the germanium absorption layer.

17. The device as in claim 16 wherein the optical waveguide comprises silicon nitride.

18. The device as in claim 1 wherein the device comprises an avalanche photodiode.

19. The device as in claim 1 wherein the device comprises a single photon avalanche detector.

20. A method comprising:
    transporting an optical signal in an optical waveguide connected to a germanium absorption layer;
    receiving and absorbing photons from the optical signal, and generating one or more mobile carriers from the absorbed photons at the germanium absorption layer disposed over a charge region of a first conductivity type of a silicon surface layer;
    transporting the one or more mobile carriers through a heterojunction layer; and
    receiving the one or more mobile carriers and generating an amplified photocurrent at a multiplication region, laterally adjacent to the charge region, of the silicon surface layer, wherein the multiplication region is disjointed from the heterojunction layer.

21. The method as in claim 20 wherein the multiplication region is separate and spaced-apart from the germanium absorption layer.

22. The method as in claim 20 further comprising controlling the generated photocurrent using an integrated quenching region adjacent to the multiplication region of the silicon surface layer.

23. The method as in claim 22 wherein the quenching region comprises a passive quenching region.

24. The method as in claim 23 wherein the passive quenching region comprises a resistive region.

25. The method as in claim 22 wherein the quenching region comprises an active quenching region.

26. The method as in claim 20 wherein the charge region comprises a p-type, conductivity doped silicon region, and the multiplication region comprises an intrinsic silicon region.

27. The method as in claim 20 wherein the optical waveguide comprises an integrated, silicon-based waveguide.

28. The method as in claim 27 wherein the integrated, silicon-based waveguide comprises a single mode waveguide.

29. The method as in claim 20 further comprising receiving electrical inputs to create a bias voltage to accelerate a flow of the one or more mobile carriers into the multiplication region using two out of three electrical contact regions.

30. The method as in claim 20 further comprising coupling the optical signal to the germanium absorption layer by positioning the optical waveguide with respect to the germanium absorption layer.

31. The method as in claim 30 further comprising evanescently coupling the optical signal to the germanium absorption layer by positioning the optical waveguide with respect to the germanium absorption layer.

32. The method as in claim 30 further comprising positioning the optical waveguide on a top surface of the germanium absorption layer.

33. The method as in claim 30 further comprising positioning the optical waveguide on a side surface of the germanium absorption layer.

34. The method as in claim 30 further comprises generating a strain at an interface of the optical waveguide and the germanium absorption layer using a silicon-based material in the optical waveguide.

35. The method as in claim 34 wherein the optical waveguide comprises silicon nitride.

36. A device comprising:
- an optical waveguide configured to transport an optical signal;
- a germanium absorption layer, disposed over a charge region of a silicon surface layer, to receive and absorb photons from the optical signal, and to generate one or more mobile carriers from the absorbed photons;
- a silicon surface layer comprising,
    - a charge region of a first conductivity type, and
    - a multiplication region, laterally adjacent to the charge region, to receive the one or more mobile carriers and generate an amplified photocurrent; and
- a heterojunction layer between the germanium absorption layer and the silicon surface layer, wherein the multiplication region is disjointed from the heterojunction layer.

* * * * *